US006586828B2

(12) United States Patent
Buffet et al.

(10) Patent No.: US 6,586,828 B2
(45) Date of Patent: Jul. 1, 2003

(54) INTEGRATED CIRCUIT BUS GRID HAVING WIRES WITH PRE-SELECTED VARIABLE WIDTHS

(75) Inventors: Patrick H. Buffet, Essex Junction, VT (US); Yu H. Sun, Beaverton, OR (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,772

(22) Filed: Oct. 17, 2001

(65) Prior Publication Data

US 2003/0071343 A1 Apr. 17, 2003

(51) Int. Cl.[7] .......................... H01L 23/52; H01L 29/73
(52) U.S. Cl. ........................ 257/691; 257/775; 257/207; 257/664; 257/692; 257/923
(58) Field of Search ................................ 257/691, 775, 257/207, 664, 692, 695, 923

(56) References Cited

U.S. PATENT DOCUMENTS

| | | | | |
|---|---|---|---|---|
| 5,040,144 A | | 8/1991 | Pelley et al. ................... 365/51 |
| 5,145,800 A | | 9/1992 | Arai et al. ...................... 437/51 |
| 5,272,645 A | | 12/1993 | Kawakami et al. .......... 364/491 |
| 5,283,753 A | | 2/1994 | Schucker et al. ............ 364/490 |
| 5,404,310 A | | 4/1995 | Mitsuhashi .................. 364/490 |
| 5,793,643 A | | 8/1998 | Cai ............................. 364/491 |
| 5,923,089 A | * | 7/1999 | Yao et al. .................... 257/775 |
| 5,978,572 A | | 11/1999 | Toyonaga et al. ....... 395/500.06 |
| 6,002,857 A | | 12/1999 | Ramachandran ....... 395/500.15 |
| 6,028,440 A | | 2/2000 | Roethig et al. .............. 324/765 |
| 6,035,111 A | | 3/2000 | Suzuki et al. .......... 395/500.12 |
| 6,182,272 B1 | | 1/2001 | Andreev et al. ............... 716/13 |
| 6,184,477 B1 | | 2/2001 | Tanahashi .................... 174/261 |
| 6,185,722 B1 | | 2/2001 | Darden et al. ................. 716/5 |
| 6,202,191 B1 | | 3/2001 | Filippi et al. .................. 716/5 |

OTHER PUBLICATIONS

Increased Chip Wireability Through More Efficient Power Distribution, IBM Technical Disclosure Bulletin, vol. 38, No. 09, pp. 243–245, Sep. 1995.

* cited by examiner

*Primary Examiner*—Jasmine J B Clark
(74) *Attorney, Agent, or Firm*—Downs Rachlin Martin PLLC

(57) ABSTRACT

An electrical bus grid (108) for an application specific integrated circuit (ASIC) chip (102). The bus grid is generally formed by mutually orthogonal wires (28', 30') contained within two metal layer (M6', M7'). The bus grid is located within each of a plurality of contiguous rectangular regions (32'), which are defined by electrical contacts (12'). Due to the regular pattern of the electrical contacts, the bus grids within the contiguous rectangular regions are identical to one another, such that the bus grid forms a repeatable pattern. The widths of the wires in each of the two metal layers vary depending upon the magnitude of the current carried by the corresponding wire. The magnitude of the current in the power bus may be determined by simulation and modeling performed prior to placement of cells (e.g., 18, 20, 22) within the ASIC chip.

18 Claims, 7 Drawing Sheets

INTEGRATED CIRCUIT BUS GRID HAVING WIRES WITH PRE-SELECTED VARIABLE WIDTHS

BACKGROUND OF THE INVENTION

1. Field of the Invention

The present invention relates generally to the field of microelectronics. More particularly, the present invention is directed to an integrated circuit bus grid having wires with pre-selected variable widths.

2. Background of the Invention

A large portion of the semiconductor industry is presently devoted to the design and manufacture of application specific integrated circuit chips, or ASIC chips, which are used in many diverse applications, such as devices containing embedded systems. Examples of such devices include computers, cellular telephones, PDAs, thin clients, televisions, radios, domestic appliances, e.g., digital microwave ovens, dishwashers, clothes dryers and the like, automobiles, digital manufacturing, testing and diagnostic equipment and virtually every other digital device for consumer or industrial use. Frequently, ASICs designed for different applications contain many of the same basic logic, memory and I/O elements, or cells, as one another. However, for different applications these cells may be present in different numbers, arranged differently and have different interconnectivity, among other differences. Examples of cells include RAM, I/O, adder, clock, latches and communication ports, among others.

Since cell designs are often used repeatedly in creating new ASICs, manufacturers have built libraries of cells. When designing a new ASIC, the manufacturer may then retrieve the necessary cells from the library and combine them with one another, and perhaps with custom-designed cells, in the manner needed for a particular application. Important purposes of creating libraries containing standard cells are to reduce the cost of designing and manufacturing ASIC chips and simplify the process of designing ASICs.

In a further effort to reduce costs and simplify the design process, manufacturers often complement their cell libraries by standardizing other features of ASIC chips. For example, manufacturers often standardize the type and arrangement of electrical contacts, i.e., power, ground and I/O contacts, for interfacing a completed chip with packaging and standardize the power and ground buses that provide, respectively, power and grounding to the microelectronic devices, e.g., transistors, that make up the various cells.

FIGS. 1, 1A, 2 and 3 show a particularly useful standardized arrangement of electrical contacts and power and ground buses in connection with an exemplary ASIC die 10.

Referring to FIG. 1A, ASIC die 10 includes at its surface two interposed rectangular area arrays of power contacts 12 (e.g., VDD, VDDx) and ground contacts 14 (e.g., GND, Vref), which are shown as comprising solder balls for controlled collapse chip connection (C4), or flip-chip, connectivity with a package (not shown). As one skilled in the art will readily appreciate, electrical connectivity of power and ground contacts with a package may be alternatively effected using another technique, such as wire bonding. Also shown is a rectangular area array of I/O contacts 16 interposed with power contacts 12 and ground contacts 14. Such area arrays of contacts 12, 14, 16 allow ASIC designers to place in the X-Y plane the necessary cells, e.g., RAM cell 18, I/O cells 20, and communication port cells 22, wherever desired on die 10 such that the cells are always relatively proximate the appropriate contact(s).

FIG. 2 shows an electrical bus 11 coupling power contacts 12 with a device layer 24. Electrical bus comprises seven metal layers, M1–M7, interleaved with insulating layers, I1–I7. One skilled in the art will appreciate that the number of metal layers and insulating layers shown is for illustrative purposes only. More or fewer than seven metal layers and corresponding insulating layers may be provided. Ground contacts 14, I/O contacts 16 of FIG. 1A and associated wiring are not shown for clarity. However, one skilled in the art will understand that the electrical interconnection between ground contacts 14 and device layer 24 may be similar to the interconnection of power contacts 12 with device layer 24. Similarly, one skilled in the art will understand that I/O contacts 16 will be electrically interconnected with device layer 24 as necessary for the particular arrangement of I/O cells 20.

FIG. 3 shows metal layers M6 and M7 as forming, in plan view, a rectangular bus grid 26 comprising conductive strips, or wires 28, 30, present within each of a plurality of contiguous regions 32 defined by the rectangular area array of power contacts 12. Importantly, wires 28 have the same widths as one another and wires 30 have the same widths as one another. Referring now to FIGS. 2 and 3, metal layer M6 contains wires 28 extending in the Y-direction and metal layer M7 contains wires 30 extending in the X-direction. Wires 30 located directly beneath power contacts 12 are electrically connected to the power contacts by metal studs 34 extending through insulating layer 17. Wires 28 in metal layer M6 are electrically connected to wires 30 in metal layer M7 by metal studs 36 at each location that wires 28 cross under wires 30. As one skilled in the art will appreciate, metal layers M5 to M1 are similar to metal layers M7 and M6 but contain progressively finer wires. Wires 38 of metal layer M1 are closely spaced from one another so that each device in device layer may be electrically connected thereto.

Providing area arrays of power and ground contacts and providing uniform power and ground grids in the metal layers permit designers to lay out the power and ground buses prior to arranging the cells in the device layer. Thus, the power and ground buses may be standardized, in large part eliminating the need to custom design these buses for each new ASIC design. Presently, ASIC designers typically arrange the wires within the same metal layer in a uniform pattern and typically provide the wires within the same metal layer with the same widths. For example, wires 28 of metal layer M6 may be arranged as shown, and each wire will have the same width as the other wires 28 in metal layer M6. Similarly, wires 30 of metal layer M7 may be arranged as shown, and each wire will have the same width as the other wires 30 in metal layer M7. The width of the wires is generally based upon the maximum possible current in the corresponding metal layer. Providing such uniform widths for the wires of the same metal layer, particularly the first two metal layers, e.g., metal layers M7 and M6 in the example of FIGS. 2 and 3, immediately below the power and ground contacts, however, wastes metal and takes up valuable space that an ASIC designer could otherwise use for signal and I/O wire routing. The limited amount space available in the metal layers for signal and I/O wire routing can require an ASIC designer to provide additional metal layers that are undesirable, particularly from a cost standpoint.

BRIEF SUMMARY OF THE INVENTION

In one aspect, the present invention is directed to an integrated circuit comprising a plurality of cells and an electrical bus in electrical communication with the plurality of cells. The electrical bus is designed using a current distribution modeled prior to arrangement of the plurality of cells. The electrical bus comprises a region and a first metal layer containing a plurality of first wires extending in a first direction. Each of the plurality of first wires has a first width at least partially located within the region. The first widths vary as a function of the current distribution.

In another aspect, the present invention is directed to a method of laying out an electrical bus grid for an integrated circuit having a plurality of regions. The method comprises in sequence the following steps. First, at least a plurality of first wires of a first metal layer are arranged in at least one of the plurality of regions, wherein each of the plurality of first wires has a first width. Then, a current distribution is determined among at least the plurality of first wires, and at least the first widths of the plurality of first wires are varied as a function of the current distribution. Then, a plurality of cells is arranged to form at least a portion of the integrated circuit.

BRIEF DESCRIPTION OF THE SEVERAL VIEWS OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION OF THE INVENTION

Detailed Description of the Drawings

Figure 4:
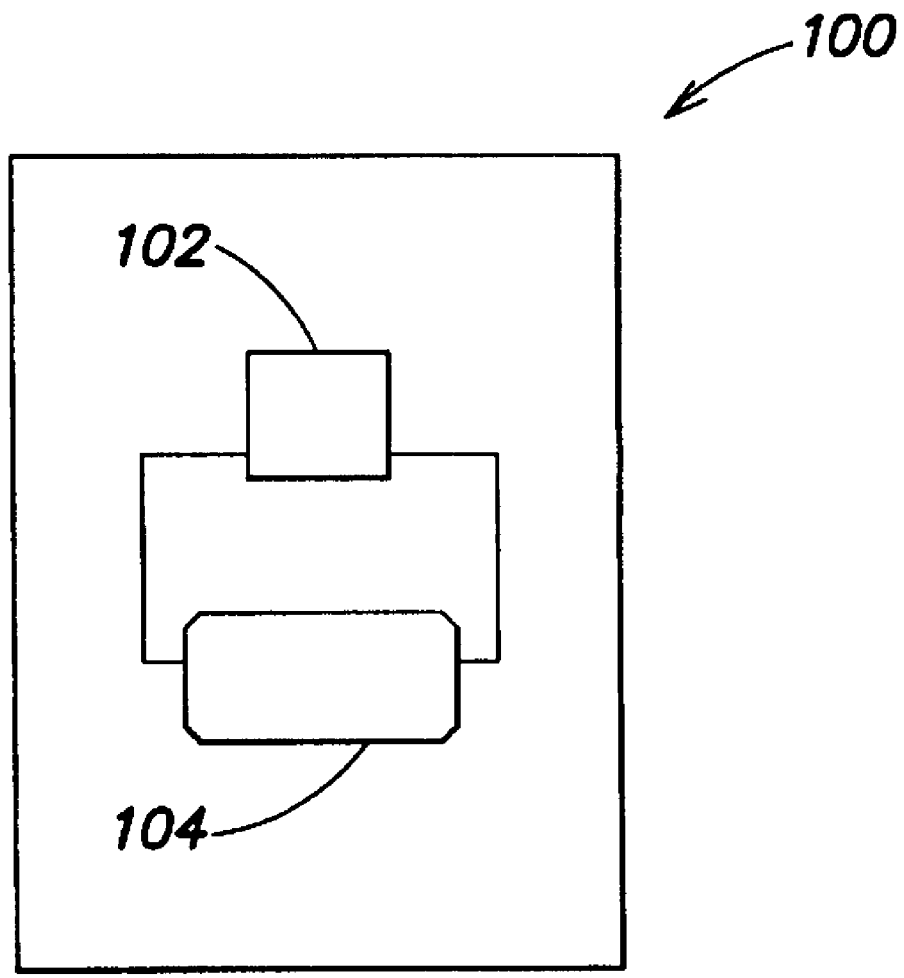
FIG. 4 is a schematic view of a device incorporating an ASIC chip of the present invention.

Referring now to the drawings, wherein like numerals indicate like elements, FIG. 4 shows in accordance with the present invention a device, which is generally denoted by the numeral 100. Device 100 may be any type of digital device, such as an embedded system device. Examples of such a device include a computer, a cellular telephone, PDA, thin client, television, radio, domestic appliance, automobile and digital manufacturing, testing and diagnostic equipment, among others. Accordingly, device 100 contains one or more integrated circuit (IC) chips, such as application specific integrated circuit (ASIC) chip 102, and may contain an onboard power supply 104 for providing power to the IC chip. One skilled in the art will appreciate that in order to understand the present invention it is not necessary to describe the general function ASIC chip 102, nor the details of how the ASIC chip interfaces with power supply 104 and other components (not shown) of device 100.

Figure 1:
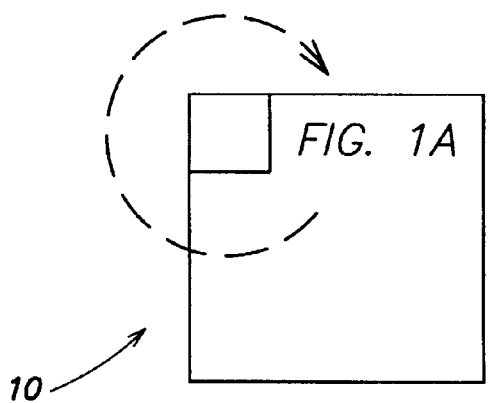
FIG. 1 is a schematic view of an ASIC die.
Figure 1A:
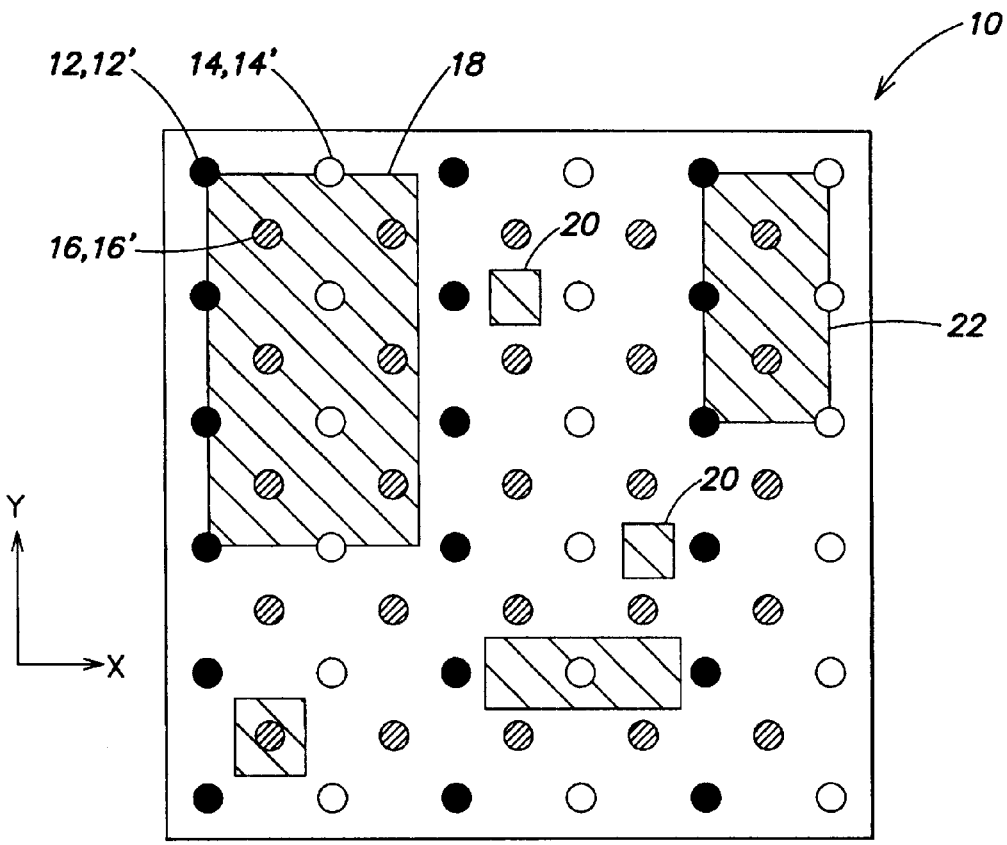
FIG. 1A is an enlarged view of a portion of the die showing an exemplary arrangement of power, ground and I/O contacts and logic, memory and I/O cells.
Figure 2:
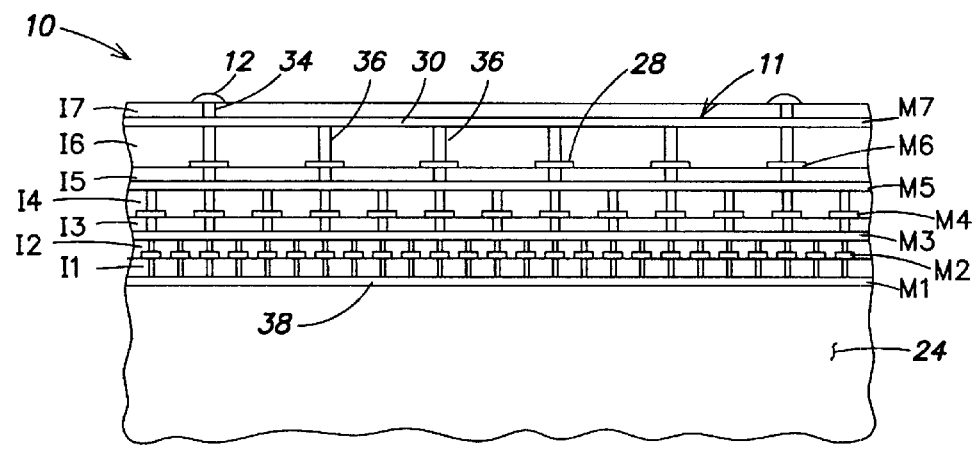
FIG. 2 is an partial cross-sectional elevational view of an ASIC die showing metal and insulting layer forming a prior art power bus.
Figure 3:
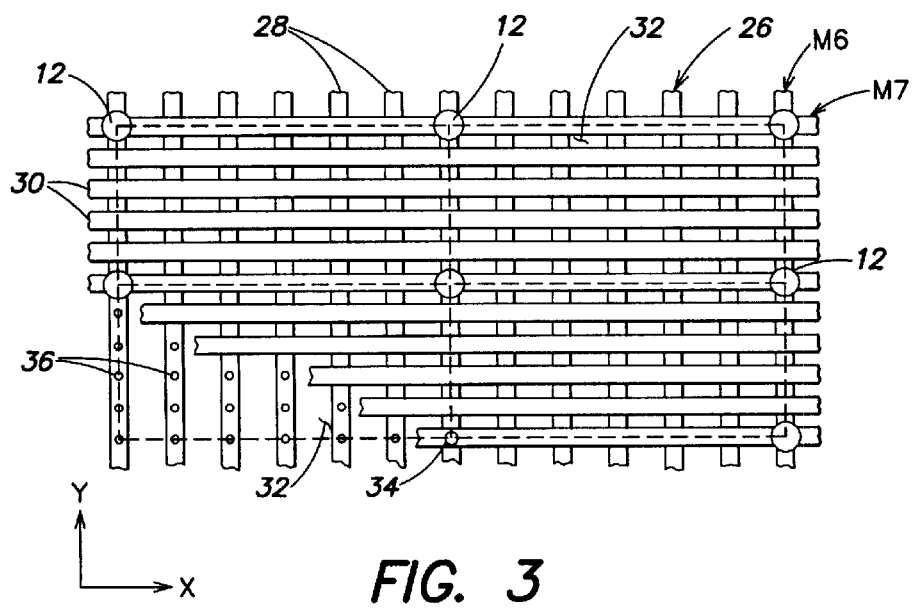
FIG. 3 is a partial plan view of the wires in metal layers M7 and M6 of the prior art power bus of FIG. 2.

The general arrangement of ASIC chip 102 may be similar to the general arrangement of die 10 shown in FIGS. 1–3. That is, ASIC chip 102 may have interposed rectangular area arrays of power contacts 12', ground contacts 14' and I/O contacts 16'. In addition, ASIC chip 102 may have seven insulating layers M1'–M7' (FIG. 2) and seven metal layers I1'–I7' (FIG. 2) for electrically connecting individual devices, such as transistors, in a device layer 24' (FIG. 2) to contacts 12', 14', 16'. One skilled in the art will recognize that although ASIC chip 102 may have seven insulating layers I1'–I7' and seven metal layers M1'–M7', it may have more or fewer such layers depending upon a particular design. In addition, one skilled in the art will understand that power contacts 12', ground contacts 14' and I/O contacts 16' may be arranged differently, such as in parallelogram area arrays.

Figure 5:
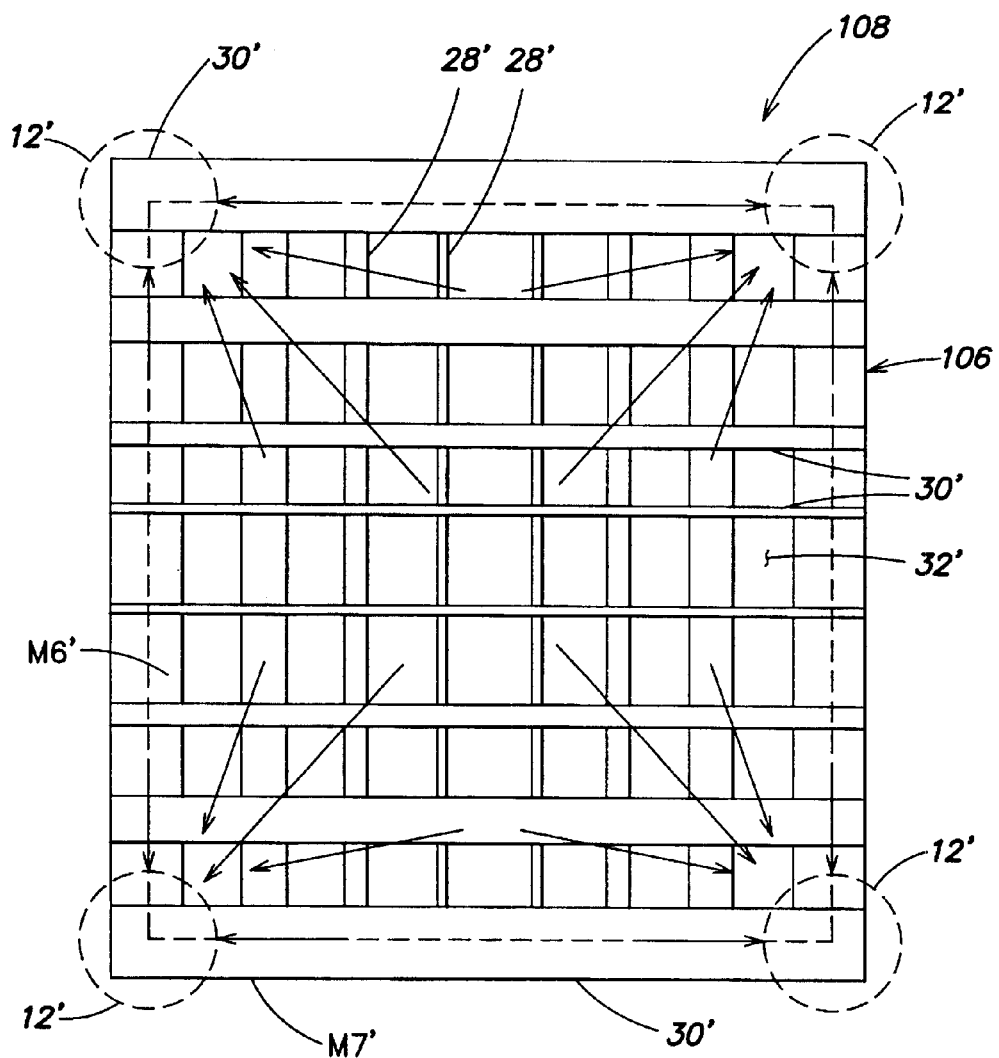
FIG. 5 is a partial plan view showing a repeatable section of the power grid of the ASIC chip shown in FIG. 4.

However, unlike die 10, wherein each metal layer M1–M7 contains electrical bus wires, e.g., wires 26, 28 (FIGS. 2 and 3), having the same width as one another, ASIC chip 102 comprises at least one metal layer that includes bus wires having different widths. As described below, it is generally most beneficial to provide different width wires in the coarsest portion of the power and ground bus grids, e.g., in the one or two metal layers most proximate contacts where the wires are relatively large. Illustratively, FIG. 5 shows uppermost metal layers M7' and M6', which correspond the uppermost metal layers M7 and M6 of FIG. 2, each containing varying width wires 30', 28'. Providing wires 28', 30' with different widths can greatly reduce the amount of metal needed for the power and ground buses. In addition, providing wires 28', 30' with different widths can also provide much more space for other purposes, such as signal and I/O wire routing, because narrower widths permit more wires to be accommodated in a given space assuming no change in wire spacing.

FIG. 5 shows a repeatable grid 106 of a power bus 108 corresponding to one of contiguous rectangular regions 32' that is defined by four power contacts 12'. Repeatable grid 106 is formed by wires 28' of metal layer M6' and wires 30' of metal layer M7'. Wires 28', 30' are shown as forming a rectangular cris-cross pattern that is symmetrical relative to the principal axes of rectangular region 32'. As one skilled in the art will appreciate, however, wires 28', 30' may form a non-rectangular crisscross pattern, such as a pattern that defines parallelogram-shaped regions corresponding to regions 32'. One skilled in the art will also appreciate that wires 28', 30' may also be arranged asymmetrically with respect to the principal axes of region 32'. As discussed below, the width of each wire 28', 30' may be based upon a current distribution modeled prior to the placement of cells in the device layer. Since the current distribution model may vary depending upon the general layout of ASIC chip 102, e.g., certain segments of regions 32' may be generally targeted for receiving certain types of cells having known high current requirements, the widths of wires 28', 30' may vary in any manner required by the corresponding current distribution model. Thus, wires 28', 32' need not necessarily decrease toward the center of region 32' as shown. In addition, as one skilled in the art will readily understand, FIG. 5 shows only repeatable grid 106 for power bus 108 for clarity. A similar repeatable grid (not shown) for the ground bus may also be provided among corresponding ground contacts 14' (FIG. 1).

As mentioned above, it is desirable to reduce the costs of designing and manufacturing ASICs. One method of reducing these costs is to design power bus 106 and the ground bus (not shown) without the need to define the arrangement of the logic, memory and I/O cells (see, e.g., FIG. 1) prior to designing these buses. This allows designers to create standard power and ground bus lay-outs that may be generally used regardless of the underlying arrangement of cells needed to provide ASIC chip 102 with the necessary functionality. Desirable features of standardized power and ground buses are that they be generally uniformly distributed over the entire device layer so that cells may be readily arranged as desired, and that they comprise simple, repeatable components. Both of these features are present in the present invention.

Figure 6:
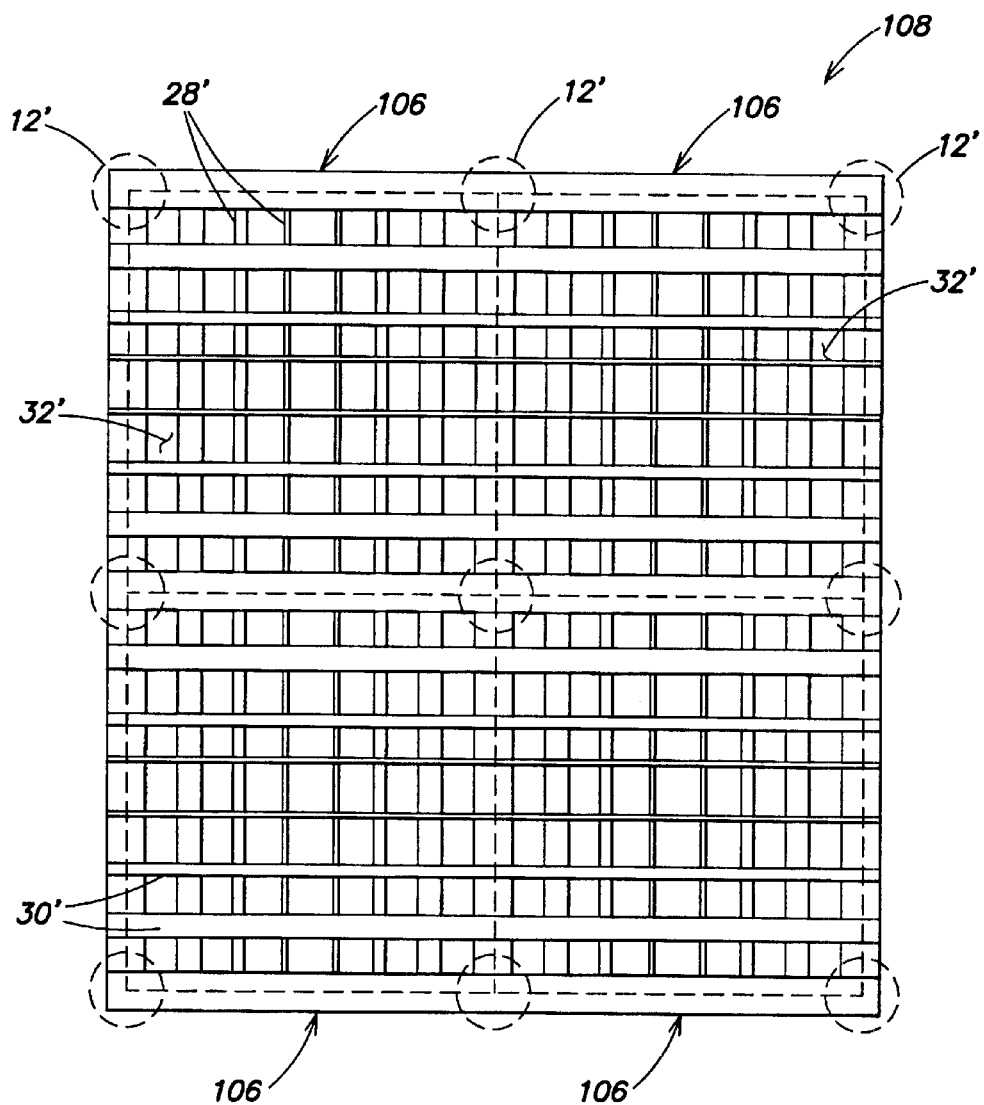
FIG. 6 is a partial plan view of a power grid illustrating the repeatable section of FIG. 5 repeated in four regions defined by an area array of nine power contacts.

FIG. 6 illustrates that, if desired, repeatable grid 106 may be used to form power bus 108 over any number of rectangular regions 32' desired simply by "placing" the repeatable grid a corresponding number of times at different rectangular regions. It is noted that providing wires 28', 30' with different widths generally has the most significant impact in the first two metal layers immediately below the level containing contacts 12', 14', 16'. This is so because of the magnitudes of the current and the corresponding relatively large wires 28', 30' in these layers. However, one skilled in the art will appreciate that any of the metal layers may contain wires of different widths in accordance with the present invention.

Figure 7:
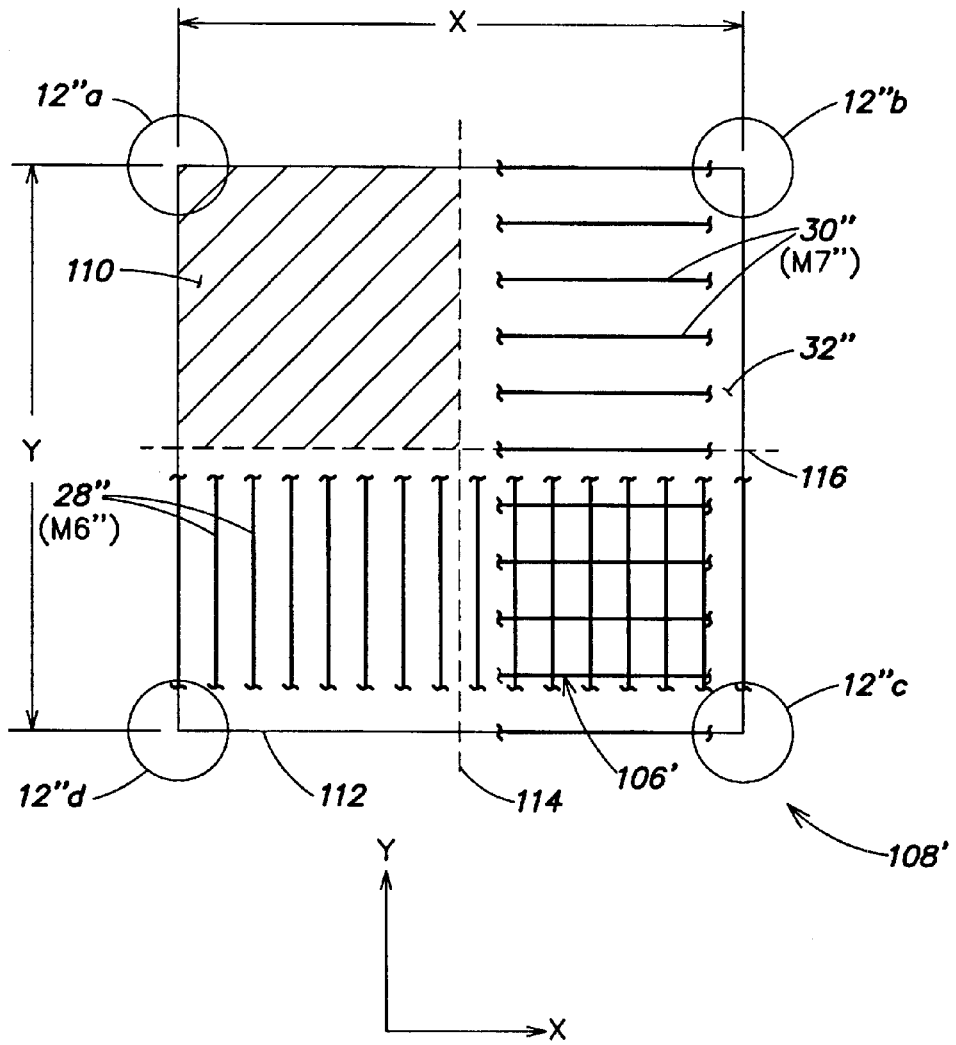
FIG. 7 is a schematic diagram of one of the regions of FIG. 6 showing a quadrant used to determine the power bus wire widths in accordance with the present invention.
Figure 8:
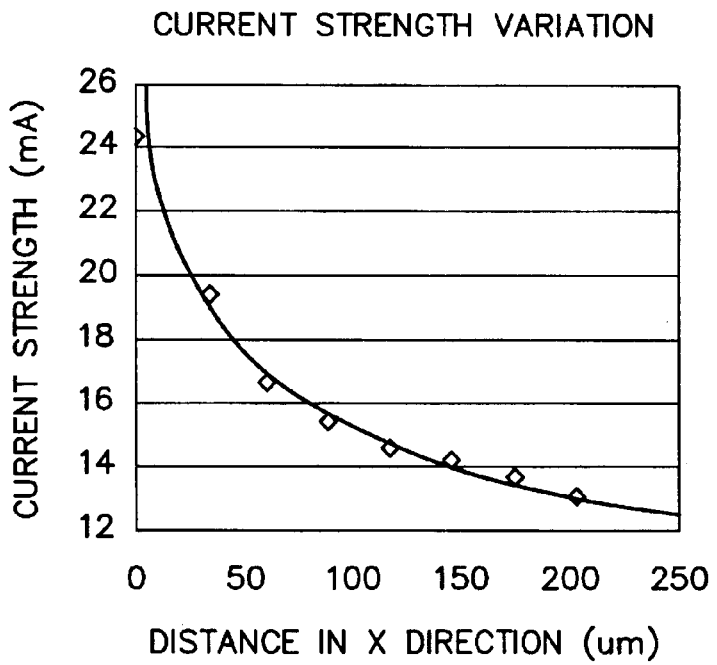
FIG. 8 is an exemplary graph of current strength versus distance from a power contact X-direction of the quadrant shown in FIG. 7.
Figure 9:
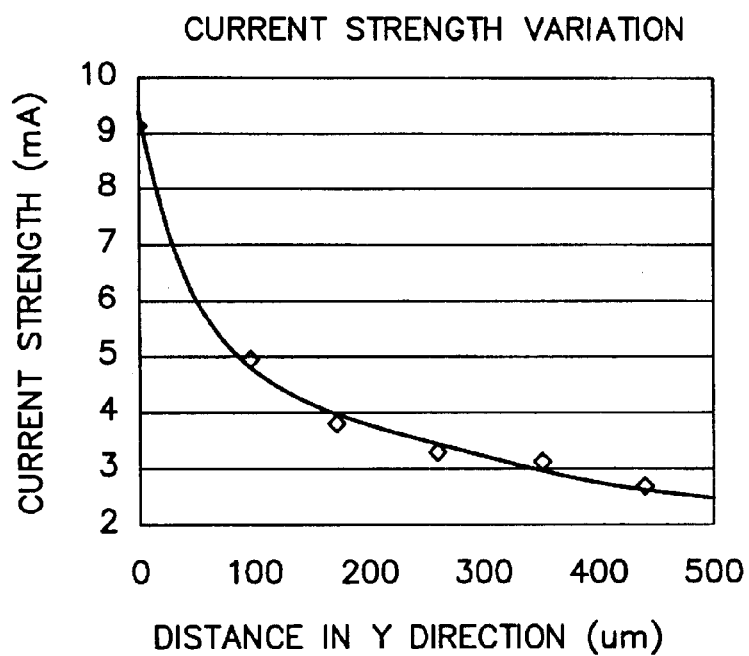
FIG. 9 is an exemplary graph of current strength versus distance from a power contact in the Y-direction of the quadrant shown in FIG. 7.

To illustrate one method of determining the various widths of the wires of power bus 108' in accordance with the present invention, the following example is presented with reference to FIGS. 7–9. For a rectangular area array of power contacts, similar to power contacts 12' shown in FIGS. 1, 5 and 6, and a symmetrical arrangement of wires similar to wires 28', 30' shown in FIG. 5, the analysis for determining the current strength in the various wires may be simplified by modeling a single quadrant 110 (FIG. 7) of one of contiguous rectangular regions 32" defined by power contacts 12"a, 12"b, 12"c and 12"d. Quadrant 110 is defined by corresponding portions of peripheral boundary 112 of region 32" and corresponding portions of two mutually orthogonal axes of symmetry 114, 116.

In the present example, the distance X from power contact 12"a to power contact 12"b, and from power contact 12"d to power contact 12"c, is 432 microns. The distance Y from power contact 12"d to power contact 12"a, and from power contact 12"c to power contact 12"b, is 864 microns. Wires 28" parallel to the Y-axis are located in metal level M6" and are spaced from one another by a distance by 28.8 microns (measured center to center). Accordingly, 16 wires 28" are provided in repeatable grid 106'. Wires 30" parallel to the X-axis are located in metal layer M7" and are spaced from one another by 86.4 microns (measured center to center). Accordingly, 11 wires 30" are provided in repeatable grid 106'.

To determine the current in each of wires 28", 30", the portions of these wires, and the corresponding studs (not shown) extending between metal layers M7", M6" containing these wires, located in quadrant 110 are each modeled as a resistor. Simulation is then performed to determine the current in the corresponding portions of wires 28", 30". This type of modeling and simulation is known in the art and is commonly used to determine the current strength in fixed-width wire buses of the prior art. Thus, a detailed description of this, and other known, modeling and simulation techniques is not required. FIGS. 8 and 9 show the results of the simulation for each of the X and Y-directions, respectively. From FIGS. 8 and 9, it is seen that the current strength in wires 28", 30" decreases logarithmically with increasing distance from power contact 12"a. Data points for the graphs of FIGS. 8 and 9 appear below in Tables I and II.

TABLE I

Current Strength and Corresponding Wire Widths in X-Direction

| Distance in X-Direction ($\mu$m) | Current Strength (mA) | Present Invention (widths vary with current) | | Prior Art (widths constant) | |
|---|---|---|---|---|---|
| | | Metal Width ($\mu$m) | Metal Width (channels)* | Metal Width ($\mu$m) | Metal Width (channels)* |
| 0 | 24.2 | 8.22 | 21 | 8.22 | 21 |
| 28.8 | 19.3 | 6.54 | 17 | 8.22 | 21 |
| 57.6 | 16.8 | 5.68 | 15 | 8.22 | 21 |
| 86.4 | 15.4 | 5.20 | 14 | 8.22 | 21 |
| 115.2 | 14.6 | 4.93 | 13 | 8.22 | 21 |
| 144.0 | 14.2 | 4.79 | 12 | 8.22 | 21 |
| 172.8 | 13.8 | 4.66 | 12 | 8.22 | 21 |
| 201.6 | 13.2 | 4.45 | 12 | 8.22 | 21 |
| TOTALS: | | 44.47 | 116 | 65.76 | 168 |

*a channel is equal to approximately 0.38 microns

TABLE II

| Distance in X-Direction ($\mu$m) | Current Strength (mA) | Present Invention (widths vary with current) | | Prior Art (widths constant) | |
|---|---|---|---|---|---|
| | | Metal Width ($\mu$m) | Metal Width (channels)* | Metal Width ($\mu$m) | Metal Width (channels)* |
| 0 | 9.08 | 3.04 | 8 | 3.04 | 8 |
| 86.4 | 4.96 | 1.63 | 5 | 3.04 | 8 |
| 172.8 | 3.84 | 1.25 | 4 | 3.04 | 8 |
| 259.2 | 3.32 | 1.07 | 3 | 3.04 | 8 |
| 345.6 | 3.12 | 0.99 | 3 | 3.04 | 8 |
| 432.0 | 2.71 | 0.86 | 3 | 3.04 | 8 |
| TOTALS: | | 8.84 | 26 | 18.24 | 48 |

*a channel is equal to approximately 0.38 microns

From Tables I and II it is seen that providing different width wires 28", 30" results in significant savings in metal required to fabricate power bus 108. For wires 28" extending in the Y-direction (Table 1), the material saving in quadrant 110 is (65.76−44.47)×432=9,197.28 μm². This is a saving of ((65.76−44.47)/65.76)×100=32%. Similarly, for wires 30" extending in the X-direction (Table II), the material saving in quadrant 110 is (18.24−8.84)×216=2,030.40 μm². This is a saving of ((18.24−8.84)/18.84)×100=50%. For a typical 100 mm² die, the present invention can result in a savings of more than $2.5 \times 10^5$ μm² of metal in the uppermost metal layers, e.g., M7" and M6".

In addition to the savings in the amount of metal needed for power bus 108' and/or the corresponding grounding grid (not shown), the present invention significantly increases the space available for signal and I/O wiring. Often, modern chips are limited by the availability of space, also known as "porosity," for such wiring. The "porosity" of a metal layer is equal to the proportion of metal available for signal and I/O wiring to the maximum amount of metal that can be provided for the power grid wires, grounding grid wires and signal and I/O wiring. Limited porosity typically results in providing additional wiring layers, which is expensive.

In the present example, the "width" of quadrant 110 in the X-direction is 216 μm, which is approximately the total amount of space available for power bus, ground bus, signal and I/O wiring in this quadrant. In this example, it is assumed that the widths of power bus and ground wires are equal to one another and are located alternatingly with one another. For these constant width wires of the prior art, power and ground bus wires would occupy approximately 2×65.76=131 μm of the 216 μm total width of quadrant 110, or (131/216)×100=61% of the total width of the quadrant. Thus, the corresponding porosity in quadrant 110 for a chip of prior art would be 100%–61%=39%.

However, for different width wires 28" of the present invention, the power and ground bus wires in metal layer M6" would occupy approximately 2×44.47=88.94 μm of the 216 μm total width of quadrant 110, or (88.94/216)×100=41% of the total width of the quadrant. Thus, the porosity of metal layer M6" in quadrant 110 according to the present invention would be 100%–41%=59%. By providing different width wires 28" in accordance with the present invention, the improvement in porosity of metal layer M6" is 59%–39%=20%. In relative terms, the improvement is (20/39)×100=51%.

Similarly, the "width" of quadrant 110 in the X-direction is 432 μm, which is approximately the total amount of space available for power bus, ground bus, signal and I/O wiring in this quadrant. Again, it is assumed that the widths of power and ground bus wires are equal to one another and are located alternatingly with one another. For these constant width wires of the prior art, power and ground bus wires would occupy approximately 2×18.24=36.48 μm of the 432 μm total width quadrant, or (36.48/432)×100=8% of the total width of the quadrant. Thus, the porosity in quadrant 110 for a chip of prior art would be 100%–8%=92%.

However, for different width wires 30" of the present invention, the power and ground bus wires would occupy approximately 2×8.84=17.68 μm of the 432 μm total width quadrant, or (17.68/432)×100=4%. Thus, the porosity of metal layer M7" in quadrant 110 would be 100%–4%=96%. By providing different width wires 30" in accordance with the present invention, the improvement in porosity of metal layer M7" would be 96%–92%=4%. In relative terms, the improvement is (4/92)×100=4%. As expected, the impact of the present invention is most dramatic for metal layer M6, where the individual wires of power bus 108' carry the most current and, therefore, require the greatest widths.

While the present invention has been described in connection with a preferred embodiment, it will be understood that it is not so limited. On the contrary, it is intended to cover all alternatives, modifications and equivalents as may be included within the spirit and scope of the invention as defined in the appended claims.

What is claimed is:

1. An integrated circuit, comprising:
    a plurality of cells; and
    an electrical bus in electrical communication with said plurality of cells, said electrical bus designed using a current distribution modeled prior to arrangement of said plurality of cells, said electrical bus comprising:
        a region having a rectangular shape and a first axis of symmetry; and
        a first metal layer containing a plurality of first wires extending in a first direction, each of said plurality of first wires having a first width at least partially located within said region and being parallel to said first axis of symmetry;
        wherein said first widths of said plurality of first wires decrease toward said first axis of symmetry.

2. An integrated circuit according to claim 1, wherein said first widths decrease logarithmically toward said axis of symmetry.

3. An integrated circuit according to claim 1, wherein said region has a second axis of symmetry and further comprises a second metal layer containing a plurality of second wires parallel to said second axis of symmetry and electrically coupled to said plurality of first wires, each of said plurality of second wires having a second width at least partially located within said region, said second widths decreasing toward said second axis of symmetry.

4. An integrated circuit according to claim 3, wherein said first widths decrease logarithmically toward said first axis of symmetry and said second widths decrease logarithmically toward said second axis of symmetry.

5. A device, comprising:
    a semiconductor chip containing a plurality of cells and having at least one electrical bus designed using a current distribution modeled prior to arrangement of said plurality of cells, said semiconductor chip comprising:
        an area array of electrical contacts; and
        a plurality of regions defined by said area array, each of said plurality of regions containing a first metal layer having a plurality of first wires extending in a first direction and electrically coupled to said electrical contacts, each of said plurality of first wires having a first width;
        wherein said first widths of said first wires vary in each of said plurality of regions as a function of said current distribution; and
    a power supply in electrical communication with said semiconductor chip.

6. A device according to claim 5, wherein said plurality of first wires in a first of said plurality of regions is identical to said plurality of first wires in others of said plurality of regions.

7. A device according to claim 5, wherein said plurality of first wires are linear and each of said plurality of regions is rectangular in shape and has an axis of symmetry parallel to each of said plurality of first wires.

8. A device according to claim 5, wherein each of said plurality of regions further comprises a second metal layer containing a plurality of second wires extending in a second direction different from said first direction, each of said plurality of second wires electrically coupled to said electrical contacts and having a second width, said second widths varying in proportion to said current distribution.

9. A device according to claim 7, wherein said first widths of said plurality of first wires decrease toward said axis of symmetry.

10. A device according to claim 9, wherein said first widths decrease logarithmically toward said axis of symmetry.

11. A device according to claim 8, wherein each of said plurality of first wires is linear and each of said plurality of second wires is linear, each of said plurality of regions being rectangular in shape and having a first axis of symmetry parallel to each of said plurality of first wires and a second axis of symmetry parallel to each of said plurality of second wires.

12. A device according to claim 11, wherein said first widths decrease toward said first axis of symmetry and said second widths decrease toward said second axis of symmetry.

13. A device according to claim 12, wherein said first widths decrease logarithmically toward said first axis of symmetry.

14. A device according to claim 12, wherein said second widths decrease logarithmically toward said second axis of symmetry.

15. An integrated circuit, comprising:
- an area array of electrical contacts defining a plurality of contiguous rectangular regions each having a first axis of symmetry and a second axis of symmetry transverse to said first axis of symmetry; and
- an electrical bus grid formed within each of said contiguous rectangular regions, said repeatable electrical bus grid comprising:
  - a first metal layer electrically connected to said electrical contacts;
  - a plurality of first wires located in said first metal layer and extending parallel to said first axis of symmetry and spaced laterally from one another;
  - wherein said plurality of first wires in each of said contiguous rectangular region have first widths that generally decrease in a direction toward said first axis of symmetry.

16. An integrated circuit according to claim 15, wherein said first widths decrease logarithmically to said first axis of symmetry.

17. An integrated circuit according to claim 16, further comprising a second metal layer spaced from said first metal layer and a plurality of second wires located in said second metal layer and extending parallel to said second axis of symmetry and spaced laterally from one another, said plurality of second wires being electrically connected to said plurality of first wires and having second widths that decrease in a direction toward said second axis of symmetry.

18. An integrated circuit according to claim 17, wherein said first widths decrease logarithmically toward said first axis of symmetry and said second widths decrease logarithmically toward said second axis of symmetry.

* * * * *